(12) United States Patent
Duan et al.

(10) Patent No.: US 11,549,758 B2
(45) Date of Patent: Jan. 10, 2023

(54) MICROCHANNEL HEAT EXCHANGER STRUCTURE WITH NOZZLE AND WORKING METHOD THEREOF

(71) Applicant: ENERGY RESEARCH INSTITUTE OF SHANDONG ACADEMY OF SCIENCES, Shandong (CN)

(72) Inventors: Lian Duan, Jinan (CN); Zhigang Liu, Jinan (CN); Mingming Lv, Jinan (CN); Lei Jia, Jinan (CN)

(73) Assignee: ENERGY RESEARCH INSTITUTE OF SHANDONG ACADEMY OF SCIENCES, Jinan (CN)

(*) Notice: Subject to any disclaimer, the term of this patent is extended or adjusted under 35 U.S.C. 154(b) by 209 days.

(21) Appl. No.: 17/049,491

(22) PCT Filed: Apr. 11, 2019

(86) PCT No.: PCT/CN2019/082175
§ 371 (c)(1),
(2) Date: Oct. 21, 2020

(87) PCT Pub. No.: WO2020/181605
PCT Pub. Date: Sep. 17, 2020

(65) Prior Publication Data
US 2021/0247142 A1 Aug. 12, 2021

(30) Foreign Application Priority Data
Mar. 12, 2019 (CN) .................. 201910185490.X

(51) Int. Cl.
*H01L 23/473* (2006.01)
*F28D 7/16* (2006.01)

(52) U.S. Cl.
CPC ........ *F28D 7/1607* (2013.01); *H01L 23/4735* (2013.01)

(58) Field of Classification Search
CPC ...... H01L 23/473; H01L 23/4735; F28F 3/12; F28F 2260/02
See application file for complete search history.

(56) References Cited

U.S. PATENT DOCUMENTS 9,622,380 B1 4/2017 Joshi et al.
10,096,537 B1* 10/2018 Chen .................. F28D 15/0266
(Continued)

FOREIGN PATENT DOCUMENTS

CN 1979825 A 6/2007
CN 101416307 A 4/2009
(Continued)

OTHER PUBLICATIONS

Dec. 18, 2019 Written Opinion issued in International Patent Application No. PCT/CN2019/082175.
(Continued)

*Primary Examiner* — Eric S Ruppert
(74) *Attorney, Agent, or Firm* — Oliff PLC

(57) ABSTRACT

A microchannel heat exchanger structure with a nozzle and a working method thereof. The microchannel heat exchanger structure with a nozzle, includes a first heat exchange portion, a second heat exchange portion, and at least one nozzle portion between the first heat exchange portion and the second heat exchange portion, the first heat exchange portion having a high-pressure heat exchange channel, a first micro-fin array being provided inside the high-pressure heat exchange channel, and the second heat exchange portion having a low-pressure heat exchange channel, the high-pressure heat exchange channel and the low-pressure heat exchange channel being in communication through at least one nozzle disposed in the nozzle
(Continued)

portion. The heat exchanger structure has a good heat exchange effect and can achieve a better heat flux during heat exchange.

8 Claims, 1 Drawing Sheet

(56) References Cited

U.S. PATENT DOCUMENTS

| | | | |
|---|---|---|---|
| 10,157,817 B1* | 12/2018 | Zhou | H01L 21/4857 |
| 2002/0112847 A1* | 8/2002 | Nakahama | H01L 23/4735 |
| | | | 165/104.11 |
| 2006/0080975 A1* | 4/2006 | Tilton | H01L 23/427 |
| | | | 62/309 |
| 2006/0157227 A1* | 7/2006 | Choi | H01L 23/427 |
| | | | 165/104.21 |
| 2012/0170222 A1 | 7/2012 | Dede et al. | |

FOREIGN PATENT DOCUMENTS

| | | |
|---|---|---|
| CN | 209639574 U | 11/2019 |
| JP | 3801576 B2 | 7/2006 |

OTHER PUBLICATIONS

Dec. 18, 2019 International Search Report issued in International Patent Application No. PCT/CN2019/082175.

\* cited by examiner

MICROCHANNEL HEAT EXCHANGER STRUCTURE WITH NOZZLE AND WORKING METHOD THEREOF

BACKGROUND

Technical Field

The present invention relates to the technical field of heat exchange devices, and in particular, to a microchannel heat exchanger structure with a nozzle and a working method thereof.

Related Art

In many military and civilian fields such as new-generation electronic chips, high-power laser weapons, radar, and nuclear energy, etc., heat fluxes of heat dissipation of some devices have exceeded 1000 W/cm$^2$. The heat dissipation problem becomes one of main bottlenecks hindering development of high technologies such as computer chips, etc. to higher performance. If heat generated by an electronic device cannot be dissipated in time, temperature of the device will rise continuously, which will seriously affect the reliability and service life of the electronic device. Therefore, there is an urgent need to develop new high-efficiency high heat flux cooling technology to obtain a greater cooling capacity to meet an urgent need for heat dissipation of high-integration and high-power devices in the frontier field.

Flow boiling phase change heat transfer in microchannels has extremely broad application prospects in heat dissipation with a high heat flux. Particularly, heat transfer through boiling in microchannels with micro-fin arrays is a hotspot in research and application of heat dissipation with a high heat flux in recent years. Some research results have been achieved. However, the inventors found that the in the prior art, intensified heat transfer is achieved mainly by changing a shape, a size, and a surface characteristics of the micro-fin array, improving only a limited heat transfer capacity and failing to meet heat dissipation requirements of next-generation microelectronic devices.

SUMMARY

The present invention is intended to provide a microchannel heat exchanger structure with a nozzle to overcome the above disadvantages of the prior art. The microchannel heat exchanger structure with a nozzle has an extremely high critical heat flux and can greatly increase ultimate heat dissipation intensity of micro-scale heat dissipation.

In order to achieve the objective, the following technical solutions are used in the present invention:

a microchannel heat exchanger structure, including a first heat exchange portion, a second heat exchange portion, and at least one nozzle portion between the first heat exchange portion and the second heat exchange portion, the first heat exchange portion having a high-pressure heat exchange channel, a first micro-fin array being provided inside the high-pressure heat exchange channel, and the second heat exchange portion having a low-pressure heat exchange channel, the high-pressure heat exchange channel and the low-pressure heat exchange channel being in communication through at least one nozzle disposed in the nozzle portion, the nozzle being a Laval nozzle or a conical nozzle.

A working method of the present invention is as follows: a first heat exchange portion is in contact with an external heat source, and a heat exchange medium flows into a high-pressure heat exchange channel and absorbs heat in the high-pressure heat exchange channel to exchange heat through boiling, a gas-liquid mixture obtained after the boiling being sprayed to a low-pressure heat exchange channel through a plurality of nozzles disposed inside a nozzle portion, and flowing out after secondary heat absorption in the low-pressure heat exchange channel, where when the heat flux rises to a specific level during the heat exchange, the nozzle produces a high-speed jetting effect, accelerating a speed at which gas generated through boiling leaves a wall surface with which the heat exchange medium exchanges heat, produces high-speed convective heat exchange inside the nozzle, and forms heat dissipation through high-speed spray inside the low-pressure heat exchange channel, to enhance a heat exchange capacity.

Beneficial effects of the present invention are as follows:

According to the microchannel heat exchanger structure with a nozzle of the present invention, the nozzle portion with the nozzle is disposed between the first heat exchange portion and the second heat exchange portion, so that after the heat flux rises to the specific level during the heat exchange, a high-speed jet can be formed inside the nozzle, greatly increasing the leaving speed of the gas obtained through boiling. In addition, high-speed convective heat exchange is formed inside the nozzle, and heat dissipation through high-speed spray is formed inside the low-pressure heat exchange channel, greatly enhancing the heat exchange capacity of the heat exchanger structure, and enabling the heat exchanger structure to reach an extremely high critical heat flux.

BRIEF DESCRIPTION OF THE DRAWINGS

The accompanying drawings constituting a part of this application are used for providing further understanding for this application. Exemplary embodiments of this application and descriptions thereof are used for explaining this application and do not constitute a limitation to this application.

Figure 1:
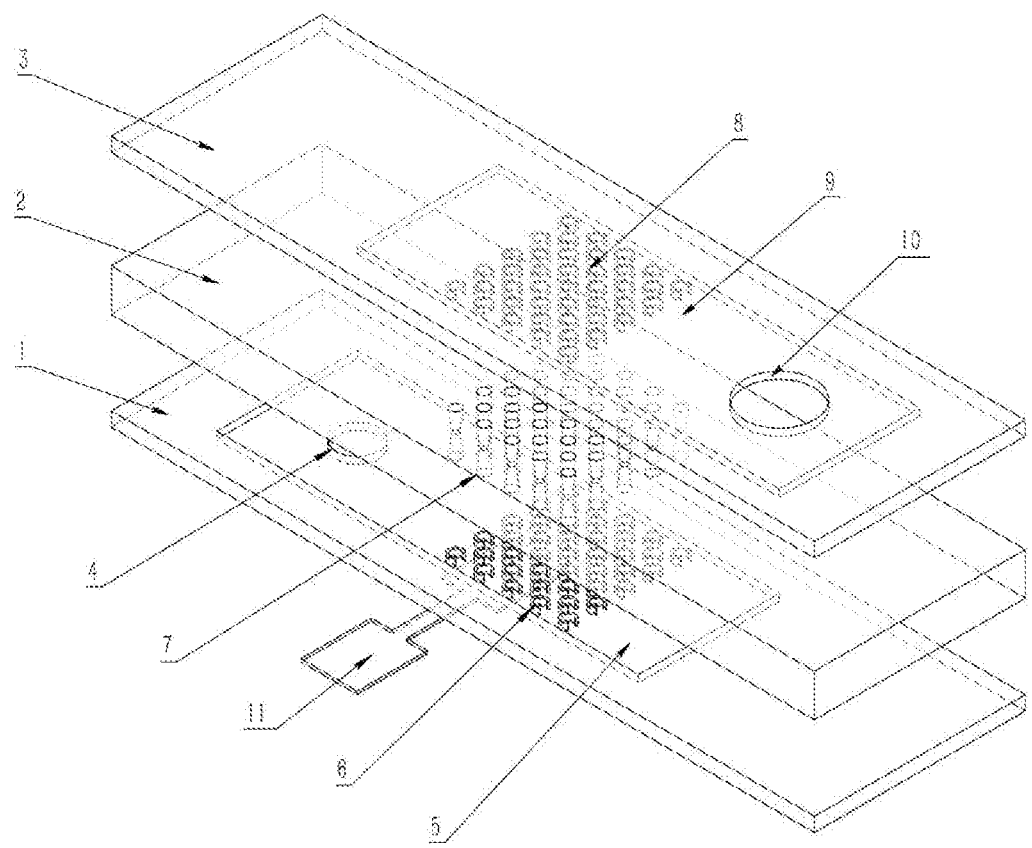
FIG. 1 is a schematic diagram of an exploded structure according to an embodiment of the present invention.

1. First heat exchange portion; 2. Nozzle portion; 3. Second heat exchange portion; 4. Medium inlet; 5. First groove; 6. First micro-fin array; 7. Nozzle; 8. Second micro-fin array; 9. Second groove; 10. Medium outlet; 11. External heat source.

DETAILED DESCRIPTION

It should be noted that the following detailed descriptions are all exemplary and are intended to provide a further understanding of this application. Unless otherwise specified, all technical and scientific terms used herein have the same meaning as commonly understood by those of ordinary skill in the art to which this application belongs.

It should be noted that terms used herein are only for describing specific implementations and are not intended to limit exemplary implementations according to this application. As used herein, the singular form is intended to include the plural form, unless the context clearly indicates otherwise. In addition, it should further be understood that terms "comprise" and/or "include" used in this specification indicate that there are features, steps, operations, devices, components, and/or combinations thereof.

For convenience of description, the words "above", "below", "left", and "right" only indicate directions consistent with those of the accompanying drawings, are not intended to limit the structure, and are used only for ease and brevity of illustration and description, rather than indicating or implying that the mentioned device or element necessarily have a particular orientation or is necessarily constructed and operated in a particular orientation. Therefore, such terms should not be construed as a limitation on the present invention.

As described in the background, in the existing microchannel flowing boiling phase-change technology, intensified heat transfer is achieved mainly by changing a shape, a size, and a surface characteristic of a micro-fin array, improving only a limited heat exchange capacity and failing to meet heat dissipation requirements of next-generation microelectronic devices. In view of the problem, this application proposes a microchannel heat exchanger structure with a nozzle.

The microchannel heat exchanger structure with a nozzle, includes a first heat exchange portion, a second heat exchange portion, and at least one nozzle portion between the first heat exchange portion and the second heat exchange portion, the first heat exchange portion having a high-pressure heat exchange channel, a first micro-fin array being provided inside the high-pressure heat exchange channel, and the second heat exchange portion having a low-pressure heat exchange channel, the high-pressure heat exchange channel and the low-pressure heat exchange channel being in communication through at least one nozzle disposed in the nozzle portion.

Further, a first groove is provided on an end surface of the first heat exchange portion located on one side at which the nozzle portion is located, and a medium inlet is provided on the other end surface, the medium inlet being in communication with the first groove. A heat exchange medium may flow into the first groove through the medium inlet.

Further, a second groove is provided on an end surface of the second heat exchange portion located on one side at which the nozzle portion is located, and a medium outlet is provided on the other end surface, the medium outlet being in communication with the second groove. A heat exchange medium in the second groove may flow out through the medium outlet.

Further, the nozzle is a Laval nozzle or a conical nozzle.

Further, the first micro-fin array includes a plurality of first cylindrical tubular structures distributed in an array, a first opening for flowing of a heat exchange medium being provided on a tube wall of the first cylindrical tubular structure.

Further, a second micro-fin array is provided in the low-pressure heat exchange channel.

Further, the second micro-fin array includes a plurality of second cylindrical tubular structures distributed in an array, a second opening for flowing of a heat exchange medium being provided on a tube wall of the second cylindrical tubular structure.

Further, an inner surface of the high-pressure heat exchange channel and a surface of the first micro-fin array are coated with a hydrophilic coating or a hydrophobic coating.

Further, an inner surface of the low-pressure heat exchange channel and a surface of the second micro-fin array are coated with a hydrophilic coating or a hydrophobic coating.

The embodiments further disclose a working method of the microchannel heat exchanger structure with a nozzle. a first heat exchange portion is in contact with an external heat source, and a heat exchange medium flows into a high-pressure heat exchange channel and absorbs heat in the high-pressure heat exchange channel to exchange heat through boiling, a gas-liquid mixture obtained after the boiling being sprayed to a low-pressure heat exchange channel through a plurality of nozzles disposed inside a nozzle portion, and flowing out after secondary heat absorption in the low-pressure heat exchange channel, where when the heat flux rises to a specific level during the heat exchange, the nozzle produces a high-speed jetting effect, accelerating a speed at which gas generated through boiling leaves a wall surface with which the heat exchange medium exchanges heat, produces high-speed convective heat exchange inside the nozzle, and forms heat dissipation through high-speed spray inside the low-pressure heat exchange channel, to enhance a heat exchange capacity.

Figure 2:
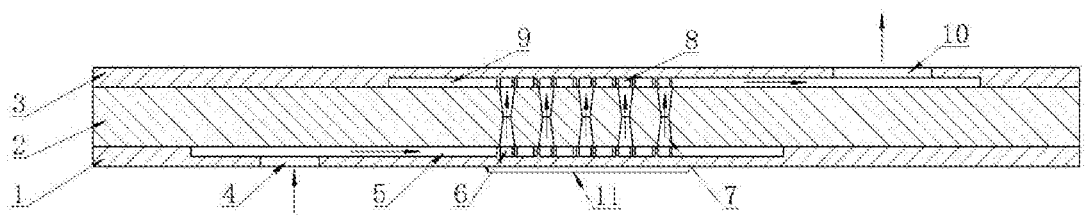
FIG. 2 is a schematic diagram of a cross-sectional structure according to an embodiment of the present invention.

This embodiment is described in detail with reference to the drawings. As shown in FIG. 1 to FIG. 2, a microchannel heat exchanger structure with a nozzle includes a first heat exchange portion 1 made of a solid material with good thermal conductivity, a second heat exchange portion 3, and a nozzle portion 2. All of the first heat exchange portion, the second heat exchange portion, and the nozzle portion adopt a plate structure. The thermally conductive solid material may be copper or aluminum, or those skilled in the art may select other thermally conductive materials according to actual requirements. The nozzle portion is disposed between the first heat exchange portion and the second heat exchange portion, and at least one nozzle portion is disposed. Those skilled in the art may set a number of the nozzle portions according to actual requirements.

A high-pressure heat exchange channel is provided inside the first heat exchange portion. Exemplarily, a first groove 5 is provided on an end surface of the first heat exchange portion located on one side at which the nozzle portion is located, and a medium inlet 4 is provided on the other end surface, the medium inlet being in communication with the first groove. The medium inlet and the first groove constitute the high-pressure heat exchange channel. Those skilled in the art may also dispose the high-pressure heat exchange channel in other manners, provided that the high-pressure heat exchange channel can meet heat exchange requirements of a heat exchange medium. Details are not described herein.

A first micro-fin array 6 is provided inside the high-pressure heat exchange channel. The first micro-fin array includes a plurality of first cylindrical tubular structures distributed according to a rectangular array and fixed at the bottom of the first groove. A first opening for flowing of a heat exchange medium is provided on a tube wall of the first cylindrical tubular structure. The first micro-fin array not only can increase a heat exchange area, but also may be used to change and guide a flowing direction and a flowing status of the heat exchange medium inside the high-pressure heat exchange channel, enhancing a heat exchange effect. The first micro-fin array may also be composed of a plurality of structures of other shapes distributed according to an array. Those skilled in the art may dispose the first micro-fin array according to an actual situation. The first micro-fin array may be processed on the first heat exchange portion, or may be processed separately and then mounted inside the high-pressure heat exchange channel of the first heat exchange portion. Those skilled in the art may also select other processing manners according to an actual situation.

A low-pressure heat exchange channel is provided inside the second heat exchange portion. Exemplarily, a second groove 9 is provided on an end surface of the second heat exchange portion located on one side at which the nozzle portion is located, and a medium outlet 10 is provided on the other end surface, the medium outlet being in communication with the second groove. The medium outlet and the second groove constitute the low-pressure heat exchange channel. Those skilled in the art may also dispose the low-pressure heat exchange channel in other manners, provided that the low-pressure heat exchange channel can meet heat exchange requirements of a heat exchange medium. Details are not described herein.

Exemplarily, a second micro-fin array 8 is provided inside the low-pressure heat exchange channel. The second micro-fin array includes a plurality of second cylindrical tubular structures distributed according to a rectangular array and fixed at the bottom of the second groove. A second opening for flowing of a heat exchange medium is provided on a tube wall of the second cylindrical tubular structure. The second micro-fin array has functions the same as those of the first micro-fin array, and may be processed in a manner same as the manner in which the first micro-fin array is processed. Details are not described herein.

A plurality of nozzles 7 distributed according to an array are provided inside the nozzle portion. Two ends of the nozzle are connected to the high-pressure heat exchange channel and the low-pressure heat exchange channel, respectively. The nozzle may be directly processed on the nozzle portion, or may be processed separately and then mounted on the nozzle portion. Those skilled in the art may select other processing manners according to actual requirements. Exemplarily, the nozzle may be a Laval nozzle, a conical nozzle (a convergent nozzle or a divergent nozzle), or a nozzle of other shapes. Those skilled in the art may select a nozzle according to actual requirements.

Exemplarily, an inner surface of the high-pressure heat exchange channel, an outer surface of the first micro-fin array, an inner surface of the low-pressure heat exchange channel, and an outer surface of the second micro-fin array may be processed and modified to form a specific hydrophilic or hydrophobic surface. The processing and the modification may be to coat a hydrophilic or hydrophobic coating on the inner surface of the high-pressure heat exchange channel, the outer surface of the first micro-fin array, the inner surface of the low-pressure heat exchange channel, and the outer surface of the second micro-fin array, or those skilled in the art may select other processing manners according to actual requirements. Details are not described herein.

Processing and modifying the inner surface of the high-pressure heat exchange channel, the outer surface of the first micro-fin array, the inner surface of the low-pressure heat exchange channel, and the outer surface of the second micro-fin array can achieve different intensified heat exchange effects such as effectively reducing resistance to the heat exchange medium, accelerating formation and leaving of bubbles, and increasing a convective heat transfer coefficient, etc., thereby further enhancing the heat transfer capacity of the heat exchanger structure.

The embodiments further disclose a working method of the microchannel heat exchanger structure with a nozzle. A first heat exchange portion of the heat exchanger structure is in contact with an external heat source 11, and a heat exchange medium flows into a high-pressure heat exchange channel through a medium inlet and absorbs heat in the high-pressure heat exchange channel to exchange heat through boiling, a gas-liquid mixture obtained after the boiling being sprayed into a low-pressure heat exchange channel through a nozzle inside a nozzle portion, and flowing out through a medium outlet after secondary heat absorption in the low-pressure heat exchange channel. After the heat flux rises to a specific level during the heat exchange, an interaction relationship among gas content generated through boiling of the heat exchange medium, values of pressure inside the high-pressure heat exchange channel and the low-pressure heat exchange channel, and a size of the nozzle reaches a specific critical value, a high-speed jetting effect is produced inside the nozzle, and an extremely high jet velocity of the heat exchange medium is formed inside the nozzle. After the high-speed jetting effect is produced, a speed at which gas generated through boiling leaves a wall surface with which the heat exchange medium exchanges heat is greatly accelerated, high-speed convective heat exchange is produced inside the nozzle, and heat dissipation through high-speed spray is formed inside the low-pressure heat exchange channel. A variety of heat dissipation effects all function inside the heat exchanger structure, greatly enhancing a heat exchange capacity of the heat exchanger structure and enabling the heat exchanger structure to achieve an extremely high critical heat flux.

The specific implementations of the present invention are described above with reference to the accompanying drawings, but are not intended to limit the protection scope of the present invention. Those skilled in the art should understand that various modifications or deformations may be made without creative efforts based on the technical solutions of the present invention, and such modifications or deformations shall fall within the protection scope of the present invention.

The invention claimed is:

1. A microchannel heat exchanger structure, comprising:
a first heat exchange portion,
a second heat exchange portion, and
at least one nozzle portion between the first heat exchange portion and the second heat exchange portion, wherein:
the first heat exchange portion has a high-pressure heat exchange channel,
a first micro-fin array is provided inside the high-pressure heat exchange channel,
the second heat exchange portion has a low-pressure heat exchange channel,
the high-pressure heat exchange channel and the low-pressure heat exchange channel are in communication through at least one nozzle disposed in the nozzle portion, the nozzle being a Laval nozzle,
the first micro-fin array comprises a plurality of first cylindrical tubular structures distributed in an array, a first opening for flowing of a heat exchange medium being provided on a tube wall of the plurality of first cylindrical tubular structures, and
a second micro-fin array is provided in the low-pressure heat exchange channel, and comprises a plurality of second cylindrical tubular structures distributed in an array, a second opening for flowing of the heat exchange medium being provided on a tube wall of the plurality of second cylindrical tubular structures.

2. The microchannel heat exchanger structure according to claim 1, wherein a first groove is provided on an end surface of the first heat exchange portion located on one side at which the nozzle portion is located, and a medium inlet is provided on the other end surface, the medium inlet being in communication with the first groove.

3. The microchannel heat exchanger structure according to claim 1, wherein a second groove is provided on an end surface of the second heat exchange portion located on one side at which the nozzle portion is located, and a medium outlet is provided on the other end surface, the medium outlet being in communication with the second groove.

4. The microchannel heat exchanger structure according to claim 1, wherein an inner surface of the high-pressure heat exchange channel and a surface of the first micro-fin array are coated with a hydrophilic coating or a hydrophobic coating.

5. A working method of the microchannel heat exchanger structure according to claim 1, wherein a heat exchange medium flows into the high-pressure heat exchange channel and absorbs heat in the high-pressure heat exchange channel to exchange heat through boiling, a gas-liquid mixture obtained after the boiling being sprayed to the low-pressure heat exchange channel through the nozzle disposed inside the nozzle portion, and flowing out after secondary heat absorption in the low-pressure heat exchange channel, wherein when a heat flux rises to a specific level during the heat exchange, the nozzle produces a jetting effect, accelerating a speed at which gas generated through the boiling leaves a wall surface with which the heat exchange medium exchanges heat, produces convective heat exchange inside the nozzle, and forms heat dissipation through spray inside the low-pressure heat exchange channel.

6. A working method of the microchannel heat exchanger structure according to claim 2, wherein a heat exchange medium flows into the high-pressure heat exchange channel and absorbs heat in the high-pressure heat exchange channel to exchange heat through boiling, a gas-liquid mixture obtained after the boiling being sprayed to the low-pressure heat exchange channel through the nozzle disposed inside the nozzle portion, and flowing out after secondary heat absorption in the low-pressure heat exchange channel, wherein when a heat flux rises to a specific level during the heat exchange, the nozzle produces a jetting effect, accelerating a speed at which gas generated through the boiling leaves a wall surface with which the heat exchange medium exchanges heat, produces convective heat exchange inside the nozzle, and forms heat dissipation through spray inside the low-pressure heat exchange channel.

7. A working method of the microchannel heat exchanger structure according to claim 3, wherein a heat exchange medium flows into the high-pressure heat exchange channel and absorbs heat in the high-pressure heat exchange channel to exchange heat through boiling, a gas-liquid mixture obtained after the boiling being sprayed to the low-pressure heat exchange channel through the nozzle disposed inside the nozzle portion, and flowing out after secondary heat absorption in the low-pressure heat exchange channel, wherein when a heat flux rises to a specific level during the heat exchange, the nozzle produces a jetting effect, accelerating a speed at which gas generated through the boiling leaves a wall surface with which the heat exchange medium exchanges heat, produces convective heat exchange inside the nozzle, and forms heat dissipation through spray inside the low-pressure heat exchange channel.

8. A working method of the microchannel heat exchanger structure according to claim 4, wherein a heat exchange medium flows into the high-pressure heat exchange channel and absorbs heat in the high-pressure heat exchange channel to exchange heat through boiling, a gas-liquid mixture obtained after the boiling being sprayed to the low-pressure heat exchange channel through the nozzle disposed inside the nozzle portion, and flowing out after secondary heat absorption in the low-pressure heat exchange channel, wherein when a heat flux rises to a specific level during the heat exchange, the nozzle produces a jetting effect, accelerating a speed at which gas generated through the boiling leaves a wall surface with which the heat exchange medium exchanges heat, produces convective heat exchange inside the nozzle, and forms heat dissipation through spray inside the low-pressure heat exchange channel.

\* \* \* \* \*